(12) United States Patent
Inoue et al.

(10) Patent No.: US 8,093,960 B2
(45) Date of Patent: Jan. 10, 2012

(54) FILTER DUPLEXER AND COMMUNICATION DEVICE

(75) Inventors: Shogo Inoue, Kawasaki (JP); Takashi Matsuda, Kawasaki (JP); Masanori Ueda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 324 days.

(21) Appl. No.: 12/411,871

(22) Filed: Mar. 26, 2009

(65) Prior Publication Data

US 2009/0273408 A1 Nov. 5, 2009

(30) Foreign Application Priority Data

Apr. 30, 2008 (JP) ................... 2008-118615

(51) Int. Cl.
*H03H 9/70* (2006.01)
*H03H 9/72* (2006.01)
*H03H 9/54* (2006.01)
*H03H 9/64* (2006.01)

(52) U.S. Cl. ......... 333/133; 333/189; 333/193; 333/195

(58) Field of Classification Search .................. 333/133, 333/187–190, 193–196; 310/313 B, 313 D
See application file for complete search history.

(56) References Cited

U.S. PATENT DOCUMENTS

| 5,499,003 | A | * | 3/1996 | Davenport | 333/195 |
|---|---|---|---|---|---|
| 5,508,667 | A | * | 4/1996 | Kondratiev et al. | 333/194 |
| 5,847,626 | A | * | 12/1998 | Taguchi et al. | 333/193 |
| 6,262,637 | B1 | | 7/2001 | Bradley et al. | |
| 6,278,342 | B1 | * | 8/2001 | Ella | 333/189 |
| 6,339,704 | B1 | * | 1/2002 | Furukawa | 455/313 |
| 6,535,080 | B2 | * | 3/2003 | Taniguchi | 333/193 |
| 7,194,247 | B2 | * | 3/2007 | Tikka et al. | 455/339 |
| 7,834,720 | B2 | * | 11/2010 | Timme | 333/187 |
| 2004/0070469 | A1 | * | 4/2004 | Plessky et al. | 333/193 |
| 2005/0070332 | A1 | | 3/2005 | Yamato | |
| 2009/0009262 | A1 | | 1/2009 | Schmidhammer et al. | |
| 2010/0109800 | A1 | | 5/2010 | Ueda et al. | |
| 2010/0150075 | A1 | | 6/2010 | Inoue et al. | |

FOREIGN PATENT DOCUMENTS

| JP | 11-346142 | * | 12/1999 |
|---|---|---|---|
| JP | 2001-7680 | * | 1/2001 |
| JP | 2001-24476 A | | 1/2001 |
| JP | 2001-111381 | * | 4/2001 |
| JP | 2005-526442 A | | 9/2005 |
| JP | 2008-508823 A | | 3/2008 |
| KR | 0238775 B1 | | 1/2000 |
| KR | 0725349 B1 | | 6/2007 |
| WO | WO 03/098802 A1 | | 11/2003 |
| WO | WO 2009/025056 A1 | | 2/2009 |
| WO | WO 2009/025106 A1 | | 2/2009 |

* cited by examiner

*Primary Examiner* — Barbara Summons
(74) *Attorney, Agent, or Firm* — Chen Yoshimura LLP

(57) ABSTRACT

A filter has a filter section that is provided with a balanced input terminal including a terminal 1 and a terminal 2 and a balanced output terminal including a terminal 3 and a terminal 4, and that passes a signal in a passband out of input balanced signals, and a balanced-to-unbalanced converter that is connected between the filter section and a single terminal. In the filter section, the frequency transfer characteristics between the terminals 1 and 3 differ from the frequency transfer characteristics between the terminals 2 and 4.

9 Claims, 14 Drawing Sheets

FILTER DUPLEXER AND COMMUNICATION DEVICE

CROSS-REFERENCE TO RELATED APPLICATION

This application is based upon and claims the benefit of priority of the prior Japanese Patent Application No. 2008-118615, filed on Apr. 30, 2008, the entire contents of which are incorporated herein by reference.

FIELD

The embodiments disclosed in the present application relate to a filter, a duplexer and a communication device.

BACKGROUND

A high-frequency communication filter can be constituted by combining a plurality of resonators that use surface acoustic waves (SAW) or bulk acoustic waves (BAW) generated by applying an AC voltage to a piezoelectric material. Such filters are characterized by allowing only electrical signals in a specific frequency band to pass. Such filters are installed in a mobile communication (high-frequency wireless communication) device such as a cellular telephone terminal, a personal handyphone system (PHS) terminal or a wireless local area network (LAN) system, for example. Japanese Laid-Open Patent Publication No. 2001-24476 discloses a ladder filter having a similar function to a SAW filter or the like and constituted with film bulk acoustic resonators (FBARs) connected in a ladder configuration.

In recent years, a boundary wave filter using boundary waves that mainly propagate along the boundary between a piezoelectric substrate and a medium formed on the piezoelectric substrate has also been developed. Such filters using SAW, BAW or boundary waves have a small profile compared with other dielectric filters or ceramic filters and have a steep roll-off. Therefore, such filters are suited to mobile communication components such as cellular telephones that are compact and require a narrow relative bandwidth.

A duplexer is an application component of such a filter. A duplexer has transmit/receive functions, and is, for example, used in a wireless apparatus with different frequencies for transmission signals and reception signals.

SUMMARY

A filter disclosed in the present application includes a filter section that is provided with a balanced input terminal including a terminal 1 and a terminal 2 and a balanced output terminal including a terminal 3 and a terminal 4, and that passes a signal in a passband out of balanced signals input from the balanced input terminal and outputs the signal from the balanced output terminal, and a balanced-to-unbalanced converter that is connected between the balanced input terminal of the filter section and a single terminal, and that divides a signal input from the single terminal into two signals of opposite phase and inputs the two signals respectively to the terminal 1 and the terminal 2 of the balanced input terminal, or a balanced-to-unbalanced converter that is connected between the balanced output terminal and a single terminal, and that combines balanced signals output from the terminal 3 and the terminal 4 of the balanced output terminal and outputs the combined signal to the single terminal. In the filter section, a frequency transfer characteristic between the terminals 1 and 3 differs from a frequency transfer characteristic between the terminals 2 and 4.

The object and advantages of the invention will be realized and attained by means of the elements and combinations particularly pointed out in the appended claims.

It is to be understood that both the foregoing general description and the following detailed description are exemplary and explanatory only and are not restrictive of the invention as claimed.

DESCRIPTION OF EMBODIMENTS

Figure 1:
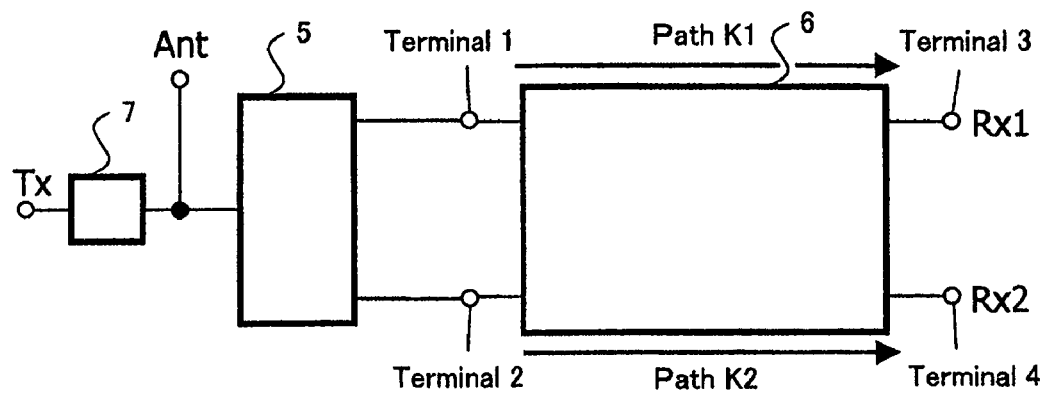
FIG. 1 depicts a circuit configuration of a duplexer in a first embodiment.

A filter of the present embodiments can, for example, be configured such that a signal input from the single terminal is output as balanced signals from terminals 3 and 4 after passing through a balance-to-unbalanced converter, terminals 1 and 2 and a filter section. In this filter, the balance characteristics (e.g., amplitude balance characteristics and phase balance characteristics) will be ideal if the frequency transfer characteristics between the single terminal and the terminal 3 match the frequency transfer characteristics between the single terminal and the terminal 4. Thus, normally, designing a filter such that the frequency transfer characteristics between the terminals 1 and 3 in the filter section equal the frequency transfer characteristics between the terminals 2 and 4 (symmetrical design) can be considered appropriate. However, the filter of the present embodiments is configured such that the frequency transfer characteristics between the terminals 1 and 3 differ from the frequency transfer characteristics between the terminals 2 and 4. The inventor of the present application found that the balance characteristics can thereby be better approximated to the ideal state than with the symmetrical design. Note that the balance characteristics can also similarly be approximated to the ideal state in the case where balanced signals input from the terminals 1 and 2 are output from the single terminal after passing through the filter section and the balance-to-unbalanced converter. That is, the balance characteristics can be improved in a filter that includes a single terminal and a balanced terminal.

The disclosure in the specification of the present application enables filter characteristics to be improved in a filter capable of balanced input or balanced output.

As an exemplary embodiment of the present invention, the filter can be configured such that in the filter section, a single-ended filter 1 is connected between the terminals 1 and 3, a single-ended filter 2 is connected between the terminals 2 and 4, and frequency transfer characteristics of the single-ended filter 1 and the single-ended filter 2 mutually differ.

The above configuration facilitates differentiating the frequency transfer characteristics between the terminals 1 and 3 from the frequency transfer characteristics between the terminals 2 and 4 by providing a single-ended filter 1 and a single-ended filter 2 in the filter section.

In the embodiments of the present invention, the filter can be configured such that the single-ended filter 1 and the single-ended filter 2 are ladder filters, and in the single-ended filter 1 and the single-ended filter 2, resonator arrangements mutually differ, or resonator arrangements are the same and at least one of mutually corresponding resonator pairs mutually differ in resonant frequency or capacitance.

The above configuration further facilitates differentiating the frequency transfer characteristics by mutually differentiating the resonator arrangements in the ladder filters, or the resonant frequencies or capacitances of mutually corresponding resonators.

In the embodiments of the present invention, the filter can be configured such that the single-ended filter 1 and the single-ended filter 2 are constituted by surface acoustic wave resonators or boundary acoustic wave resonators that each include a reflector and an interdigital transducer that has a comb-shaped electrode, and in the single-ended filter 1 and the single-ended filter 2, resonator arrangements are the same and at least one of mutually corresponding resonator pairs mutually differ in at least one of pair number of the comb-shaped electrodes, aperture length of the comb-shaped electrodes, and period of the interdigital transducers and the reflectors.

The resonant frequencies or capacitances can thus be mutually differentiated by mutually differentiating at least one of pair number of the comb-shaped electrodes, aperture length of the comb-shaped electrodes, and period of the interdigital transducers and the reflectors in corresponding resonator pairs.

In the embodiments of the present invention, the filter may be configured such that the single-ended filter 1 and the single-ended filter 2 are constituted by film bulk acoustic resonators, and in the single-ended filter 1 and the single-ended filter 2, resonator arrangements are the same and at least one of mutually corresponding resonator pairs mutually differ in at least one of shape of the film bulk acoustic resonators, area of the film bulk acoustic resonators, and thickness of film constituting the film bulk acoustic resonators.

The resonant frequencies or capacitances can thus be mutually differentiated by mutually differentiating at least one of the shape of the film bulk acoustic resonators, the area of the resonator section, and the thickness of film constituting the film bulk acoustic resonators in corresponding resonator pairs.

In the embodiments of the present invention, the filter may be configured such that the single-ended filter 1 and the single-ended filter 2 are double-mode filters that are each provided with an input interdigital transducer and an output interdigital transducer and use a surface acoustic wave or a boundary acoustic wave, and in the single-ended filter 1 and the single-ended filter 2, resonator arrangements are the same and at least one of mutually corresponding resonator pairs mutually differ in at least one of pair number of the input interdigital transducers, pair number of the output interdigital transducers, aperture length of the input and output interdigital transducers, and period of the interdigital transducers and reflector sections.

In the embodiments of the present invention, the filter may be configured such that the filter section is a balanced ladder or lattice filter that includes series resonators respectively connected in series between the terminals 1 and 3 and between the terminals 2 and 4, and parallel resonators connected between nodes on a line between the terminals 1 and 3 and nodes on a line between the terminals 2 and 4, and an n-th series resonator from the terminal 1 and an n-th series resonator from the terminal 2 mutually differ in resonant frequency or capacitance.

The above configuration facilitates differentiating the frequency transfer characteristics between the terminals 1 and 3 from the frequency transfer characteristics between the terminals 2 and 4.

In the embodiments of the present invention, the filter may be configured such that the balanced filter is constituted by surface acoustic resonators or boundary acoustic resonators that each include a reflector and an interdigital transducer that has a comb-shaped electrode, and the n-th series resonator from the terminal 1 and the n-th series resonator from the terminal 2 mutually differ in at least one of pair number of the comb-shaped electrodes, aperture length of the comb-shaped electrodes, and period of the interdigital transducers and the reflectors.

In the embodiments of the present invention, the filter may be configured such that the balanced filter is constituted by film bulk acoustic resonators, and the n-th series resonator from the terminal 1 and the n-th series resonator from the terminal 2 mutually differ in at least one of shape of the film bulk acoustic resonators, area of the film bulk acoustic resonators, and thickness of film constituting the film bulk acoustic resonators.

In the embodiments of the present invention, the filter may be configured such that the filter section is a balanced lattice filter that includes series resonators respectively connected in series between the terminals 1 and 3 and between the terminals 2 and 4, and a plurality of parallel resonators connected between nodes on a line between the terminals 1 and 3 and nodes on a line between the terminals 2 and 4, and at least one of the plurality of parallel resonators differs from the other parallel resonators in resonant frequency or capacitance.

The above configuration further facilitates differentiating the frequency transfer characteristics between the terminals 1 and 3 from the frequency transfer characteristics between the terminals 2 and 4.

In the embodiments of the present invention, the filter can be configured such that the balanced filter is constituted by surface acoustic resonators or boundary acoustic resonators that each include a reflector and an interdigital transducer that has a comb-shaped electrode, and at least one of the plurality of parallel resonators differs from the other parallel resonators in at least one of pair number of the comb-shaped electrodes, aperture length of the comb-shaped electrodes, and period of the interdigital transducers and the reflectors.

In the embodiments of the present invention, the filter can be configured such that the balanced filter is constituted by film bulk acoustic resonators, and at least one of the plurality of parallel resonators differs from the other parallel resonators in at least one of shape of the film bulk acoustic resonators, area of the film bulk acoustic resonators, and thickness of film constituting the film bulk acoustic resonators.

A duplexer that has a common terminal, a transmission terminal and a reception terminal, and includes a transmit filter connected between the common terminal and the transmission terminal and a receive filter connected between the common terminal and the reception terminal, with at least one of the transmit filter and the receive filter being a filter as described above, is also an exemplary embodiment of the present invention. A communication device provided with such a duplexer is also an exemplary embodiment of the present invention.

A filter design method disclosed in the present application is for computing by a computer an optimal arrangement and an optimal characteristic value of resonators constituting a filter, and includes a setting step of storing in a recording section accessible by the computer, circuit design data that represents a balanced-to-unbalanced conversion circuit connected between a single terminal and a balanced terminal A1 including a terminal 1 and a terminal 2, and a filter circuit provided with a plurality of resonators and connected between the balanced terminal A1 and a balanced terminal A2 including a terminal 3 and a terminal 4, wherein an arrangement and a characteristic value of resonators on a path between the terminals 1 and 3 equal an arrangement and a characteristic value of resonators on a path between the terminals 2 and 4, a changing step of changing the arrangement or the characteristic value of the resonators depicted by the circuit design data so as to differ between the resonators on the path between the terminals 1 and 3 and the resonators on the path between the terminals 2 and 4, a simulation step of reading the circuit design data changed in the changing step from the recording section, and calculating a frequency transfer characteristic between the single terminal and the balanced terminal A2, an evaluation step of generating evaluation data from the frequency transfer characteristic calculated in the simulation step, and an optimization step of computing the optimal arrangement and the optimal characteristic value of the resonators, by determining in which way to change the characteristic value of the resonators and executing the changing step, based on the evaluation data generated in the evaluation step, and repeating the simulation step and the evaluation step.

With this method, firstly in the setting step, design data is determined such that frequency transfer characteristics between the terminals 1 and 3 equal frequency transfer characteristics between the terminals 2 and 4. Subsequently, in the changing step, the design data is changed such that the characteristic values of resonators mutually differ between the terminals 1 and 3 and between the terminals 2 and 4. The frequency transfer characteristics between the single terminal and the balanced terminal A2 are then calculated using simulation analysis, and an evaluation value is computed. In the optimization step, the changing of the arrangements or characteristic values of resonators based on the evaluation value, the simulation and the evaluation are repeated. The optimal solution for the arrangements and characteristic values of resonators whereby the frequency transfer characteristics improve is thereby determined. Thus, design data for a filter with improved frequency transfer characteristics in comparison to the case where the configuration between the terminals 1 and 3 is the same as the configuration between the terminals 2 and 4 is further obtained.

First Embodiment

Configuration

FIG. 1 depicts a circuit configuration of a duplexer in a first embodiment. This duplexer includes a balanced-to-unbalanced converter 5 (hereinafter, conversion circuit 5), a receive filter 6, and a transmit filter 7. An antenna terminal (common terminal) Ant, which is a single terminal (single-ended), is connected to the transmit filter 7 and the conversion circuit 5. The conversion circuit 5 is an element that converts a single signal (reception signal) input via the antenna terminal Ant to balanced signals and outputs the balanced signals. Consequently, an input terminal of the conversion circuit 5 is constituted by a single terminal, which is a single system, and an output terminal of the conversion circuit 5 is constituted by balanced terminals (terminal 1, terminal 2), which is a dual system.

The terminal 1 and the terminal 2 are balanced input terminals of the receive filter 6, while a terminal 3 and a terminal 4 are balanced output terminals. That is, the receive filter 6 is a filter section that passes only a prescribed frequency band (reception frequency band) out of reception signals (balanced signals) input from the terminals 1 and 2, and outputs balanced signals from the terminals 3 and 4. Consequently, the terminals 3 and 4 can also be called reception terminals Rx1 and Rx2.

Note that while not depicted, a phase matching circuit may be connected between the transmit filter 7 and the conversion circuit 5. This phase matching circuit can act to prevent transmission signals output from the transmit filter 7 from flowing to the receive filter 6 side, by adjusting the impendence phase of the receive filter 6.

The receive filter 6 is configured such that the frequency transfer characteristics of a path K1 and a path K2 mutually differ, where the path K1 is the signal path between the terminals 1 and 3 and the path K2 is the signal path between the terminals 2 and 4. This configuration enables the balance characteristics (amplitude balance characteristics and phase balance characteristics) between the antenna terminal Ant and the reception terminals Rx1 and Rx2 to approach the ideal state. In turn, the pass characteristics of the receive filter 6 are also improved.

Conventionally, a balanced filter having balanced input terminals and balanced output terminals was designed such that the frequency transfer characteristics of the path K1 and the path K2 were equal. It was thought that by equating the frequency transfer characteristics of the path K1 and the path K2, the balance characteristics between the antenna terminal Ant and the reception terminals Rx1 and Rx2 could be approximated to the ideal state.

Against this background, it was found that the balance characteristics between the antenna terminal Ant and the reception terminals Rx1 and Rx2 could be approximated to the ideal state by differentiating the frequency transfer characteristics of the path K1 and the path K2. That is, it was found that by differentiating the frequency transfer characteristics of the path K1 and the path K2, the balance characteristics could be improved more than with a configuration where the frequency transfer characteristics of the path K1 and the path K2 were equal. Note that the configuration for differentiating the frequency transfer characteristics of the path K1 and the path K2 is not particularly limited. Hereinafter, a specific example of this configuration will be described.

Specific Exemplary Configuration

Figure 2:
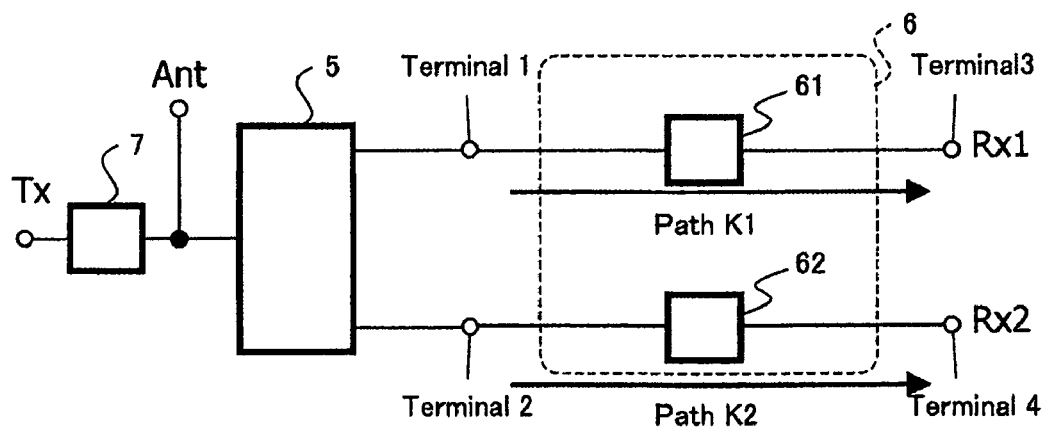
FIG. 2 depicts an exemplary configuration of a receive filter.

FIG. 2 depicts an exemplary configuration where the receive filter 6 is a balanced input/output filter that includes two single-ended filters. In the example depicted in FIG. 2, a single-ended filter 61 (hereinafter, filter 61) is connected between the terminals 1 and 3, and a single-ended filter 62 (hereinafter, filter 62) is connected between the terminals 2 and 4. In order to mutually differentiate the frequency transfer characteristics of the path K1 and the path K2 in such a balanced input/output filter, the frequency transfer characteristics of the filters 61 and 62 need only be mutually differentiated.

Figure 3:
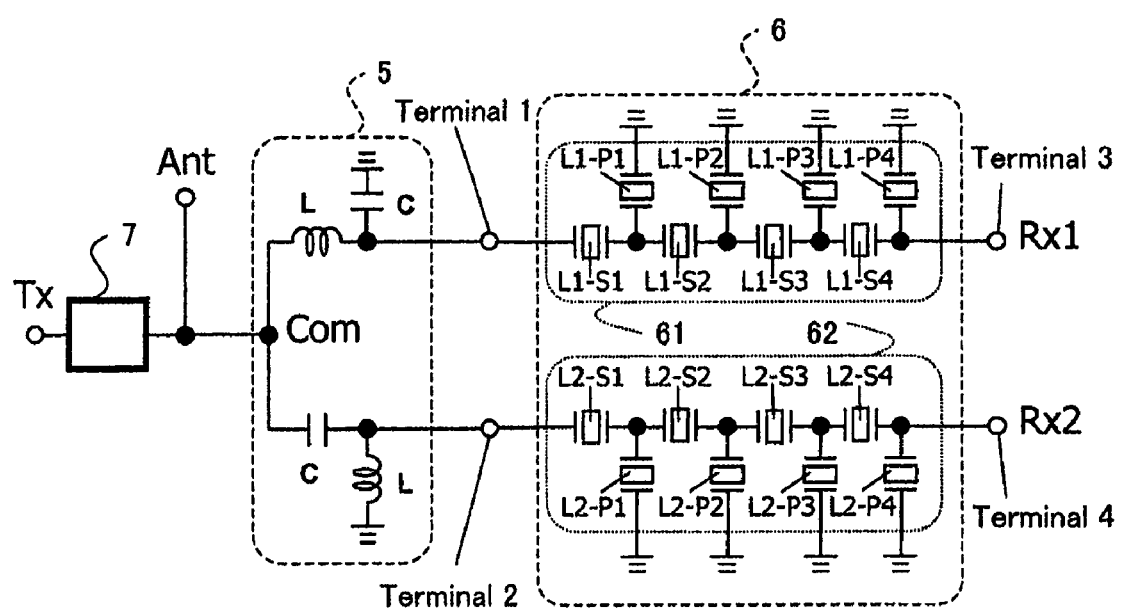
FIG. 3 depicts detailed exemplary configurations of the filter and conversion circuit depicted in FIG. 2.

FIG. 3 depicts detailed exemplary configurations of the filters 61 and 62 and the conversion circuit 5 depicted in FIG. 2. In the example depicted in FIG. 3, the conversion circuit 5 is a balanced-to-unbalanced converter (balun) with a single terminal Com as an input terminal and the terminals 1 and 2 as output terminals.

The conversion circuit 5 simultaneously outputs a signal input to the single terminal Com to the terminal 1 after delaying the phase of the signal by approximately 90 degrees, and to the terminal 2 after advancing the phase of the signal by approximately 90 degrees. In the example depicted in FIG. 3, the conversion circuit 5 is configured using a coil L and a capacitor C. The filter 61 and the filter 62 are respectively connected to the terminals 1 and 2 serving as the output terminals of the conversion circuit 5.

The filter 61 and the filter 62 are both ladder filters. The filter 61 includes series resonators L1-S1 to S4 connected in series and parallel resonators L1-P1 to P4 connected in parallel. The filter 62 similarly includes series resonators L2-S1 to S4 and parallel resonators L2-P1 to P4.

The number of resonators and the array of the series resonators and the parallel resonators are the same in the filters 61 and 62. In this case, that means that the arrangements of the resonators in the ladder filters are the same. In order to mutually differentiate the frequency transfer characteristics of the path K1 and the path K2 in the case where the resonator arrangements are the same, the characteristics of mutually corresponding resonator pairs (e.g., L1-S3 and L2-S3) of the filters 61 and 62 need only be mutually differentiated. For example, mutually differentiating the resonant frequencies or capacitances of the series resonators L1-S3 and L2-S3 results in a configuration in which the frequency transfer characteristics of the path K1 and the path K2 differ.

In this case, the resonant frequencies and capacitances of the series resonators L1-S3 and L2-S3 are set to values at which the frequency transfer characteristics between the antenna terminal Ant and the reception terminals Rx1 and Rx2 are improved. That is, the frequency transfer characteristics of the series resonators L1-S3 and L2-S3 are set such that the characteristics between the antenna terminal Ant and the reception terminals Rx1 and Rx2 improve. Characteristic values (e.g., resonant frequencies or capacitances) of the series resonators L1-S3 and L2-S3 at which the characteristics between the antenna terminal Ant and the reception terminals Rx1 and Rx2 improve can, for example, be calculated using commercial circuit simulation software. A specific exemplary calculation will be described below. Note that a plurality of the mutually corresponding resonator pairs may be set to have mutually different characteristics, rather than only one of the resonator pairs.

Figure 4A:
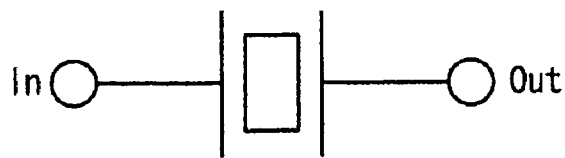
FIGS. 4A to 4D depict exemplary structures of resonators constituting the ladder filters depicted in FIG. 3.
Figure 4B:
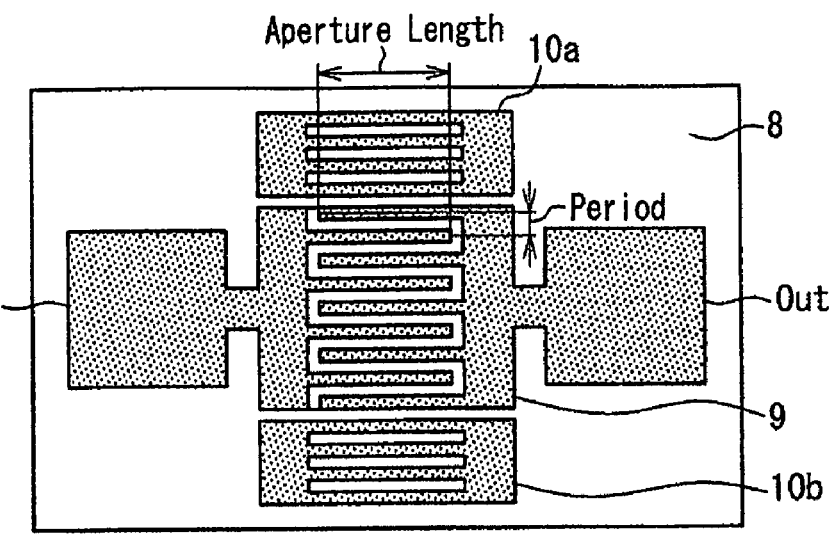

Next, exemplary structures of the resonators will be described. FIGS. 4A to 4D depict exemplary structures of the resonators constituting the ladder filters depicted in FIG. 3. FIG. 4A depicts a circuit diagram of a one-port resonator. FIG. 4B depicts an exemplary structure of a surface acoustic wave resonator. Note that a boundary acoustic wave resonator can also be configured similarly to FIG. 4B. The surface acoustic wave resonator depicted in FIG. 4B includes an interdigital transducer (IDT) 9 provided on a piezoelectric substrate 8, and reflectors 10a and 10b provided on either side of the IDT 9. An input terminal In and an output terminal Out are connected to the IDT 9 via a line pattern. Here, the frequency transfer characteristics of the resonators can be changed by changing the pair number or aperture length of the IDTs 9, the period of the IDTs and the reflectors, or the like. The frequency transfer characteristics of paths on which resonators are provided can thereby be controlled.

Figure 4C:
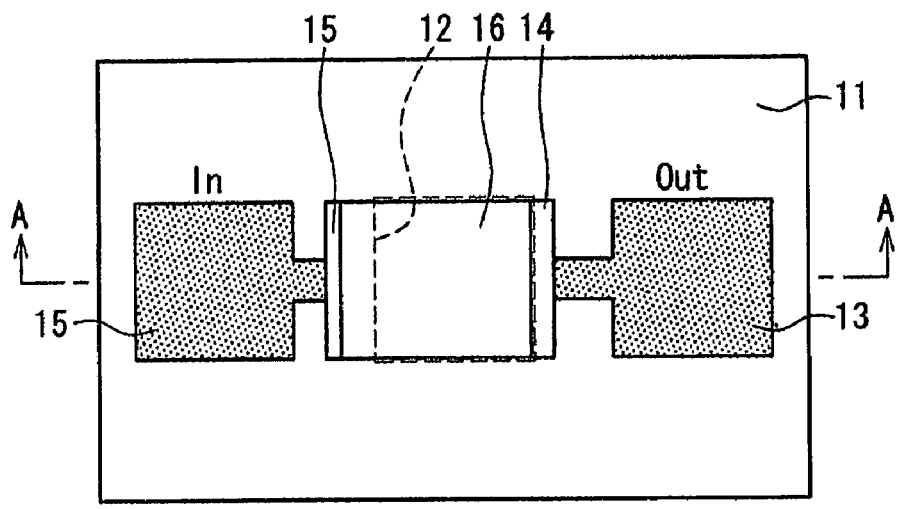
Figure 4D:
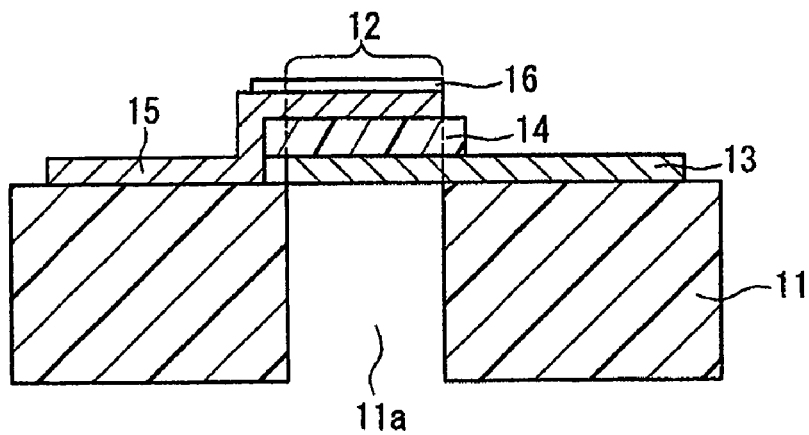

FIG. 4C is a top view depicting an exemplary structure of a film bulk acoustic resonator, and FIG. 4D is a cross-sectional view along an A-A line of the film bulk acoustic resonator depicted in FIG. 4C. The film bulk acoustic resonator is formed with a lower electrode 13, a piezoelectric film 14, an upper electrode 15 and an additional film 16 layered in order on a substrate 11. The portion where the lower electrode 13, the piezoelectric film 14, and the upper electrode 15 overlap is a resonator section, and a through hole 11a is provided in the substrate 11 below the resonator section. The frequency transfer characteristics of the film bulk acoustic resonator change as a result of changing the area or shape of the resonator section or the film thicknesses of the upper electrode 15, the lower electrode 13, the piezoelectric film 14 or the additional film 16, for example. Thus, if film bulk acoustic resonators are used in the filters 61 and 62, the frequency transfer characteristics of the paths K1 and K2 can be controlled by adjusting these design values of these film bulk acoustic resonators.

Figure 5A:
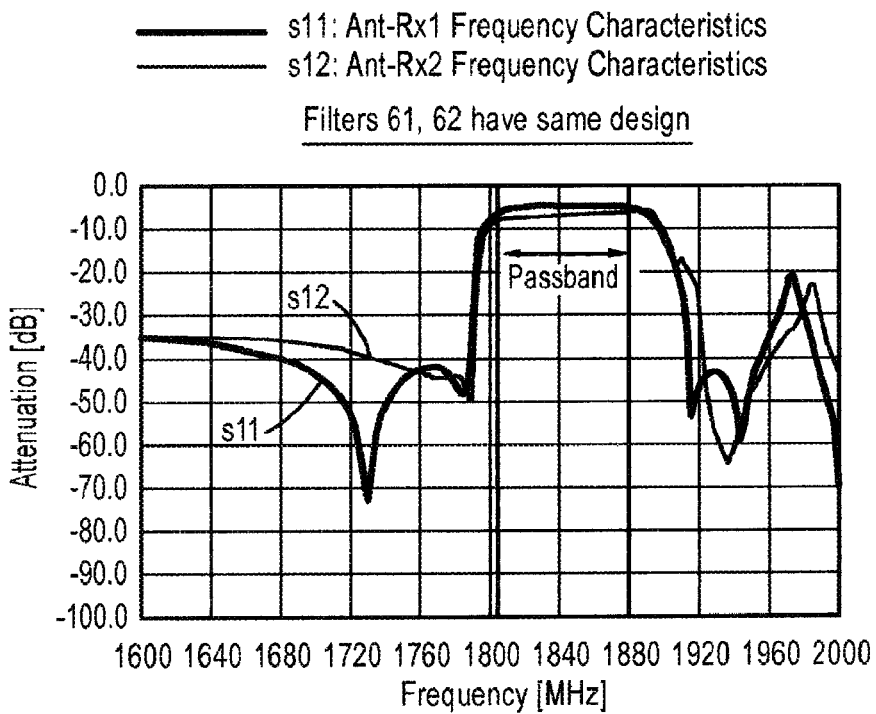
FIG. 5A is a graph depicting the result of calculating pass characteristics in the case where a filter 61 and a filter 62 are designed the same.

FIG. 5A is a graph depicting the results of calculating the pass characteristics of signals between the antenna terminal Ant and the reception terminals Rx1 and Rx2 in the case where the characteristics of the resonators L1-S1 to S4 and L1-P1 to P4 of the filter 61 are all the same as the characteristics of the corresponding resonators L2-S1 to S4 and L2-P1 to P4 of the filter 62 (i.e., same design) in the circuit configuration depicted in FIG. 3. In FIG. 5A, the thick solid line s11 indicates the Ant-Rx1 pass characteristics, while the thin solid line s12 indicates the Ant-Rx2 pass characteristics.

Figure 5B:
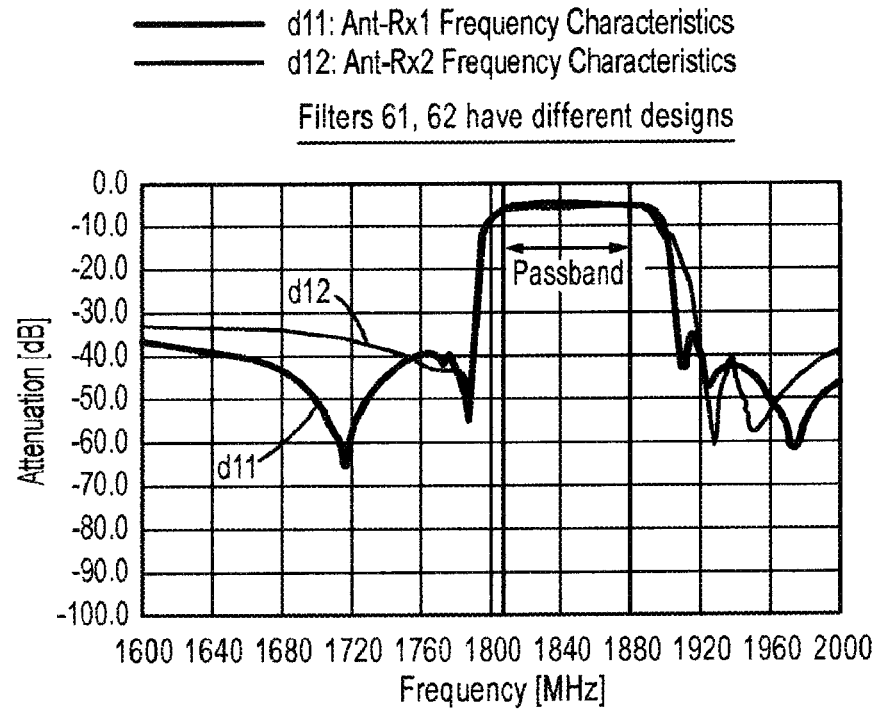
FIG. 5B is a graph depicting the result of calculating pass characteristics in the case where a filter 61 and a filter 62 are designed differently.

FIG. 5B is a graph depicting the results of calculating the pass characteristics of signals between the antenna terminal Ant and the reception terminals Rx1 and Rx2 in the case where the filters are designed such that the characteristics of the resonators L1-S1 to S4 and L1-P1 to P4 of the filter 61 all mutually differ from the characteristics of the respectively corresponding resonators L2-S1 to S4 and L2-P1 to P4 of the filter 62 in frequency transfer characteristics (i.e., different designs). In FIG. 5B, the thick solid line d11 indicates the Ant-Rx1 pass characteristics, while the thin solid line d12 indicates the Ant-Rx2 pass characteristics.

Figure 6A:
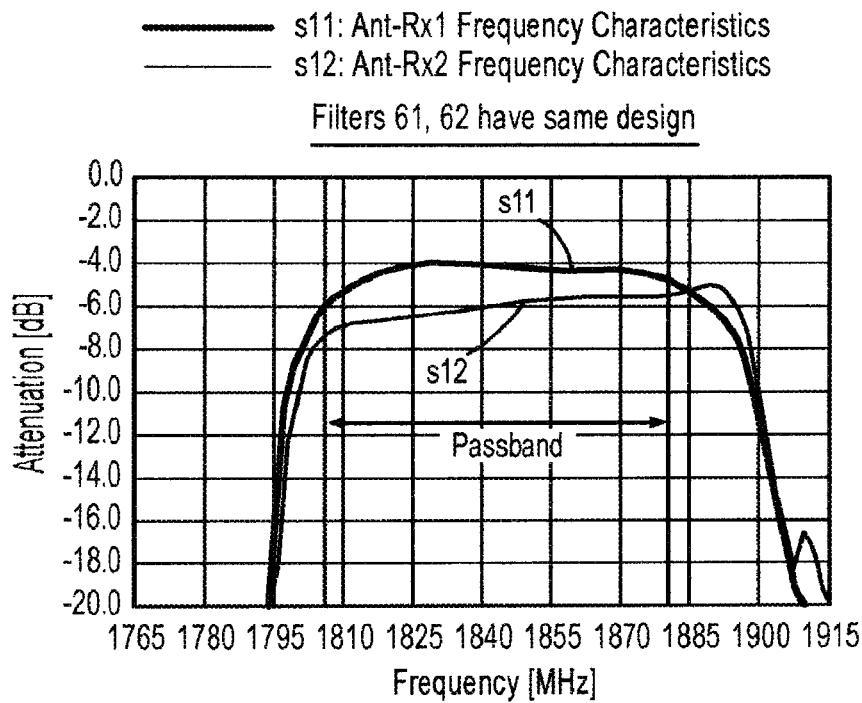
FIGS. 6A and 6B are graphs that respectively enlarge a vicinity of the passband in FIGS. 5A and 5B.
Figure 6B:
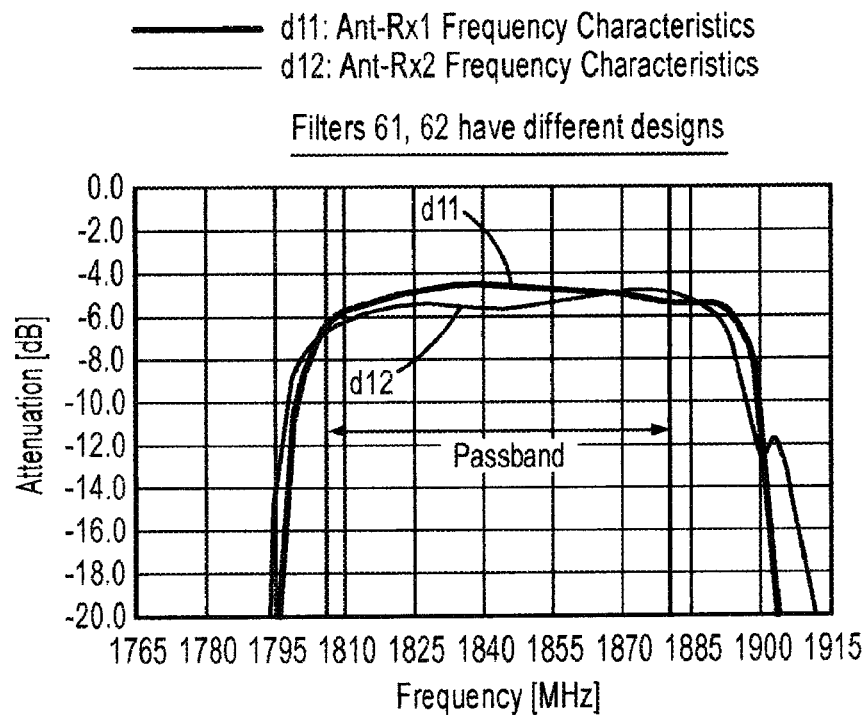

FIGS. 6A and 6B are graphs that respectively enlarge a vicinity of the passband in FIGS. 5A and 5B. In the graphs of FIGS. 6A and 6B, the difference between d11 and d12 in the case of different designs is less than the difference between s11 and d12 in the case of the same design. That is, the difference between the balanced signals output from the reception terminals Rx1 and Rx2 decreases as a result of designing the filters such that the characteristics of corresponding resonators differ between the filter 61 and the filter 62.

Figure 7A:
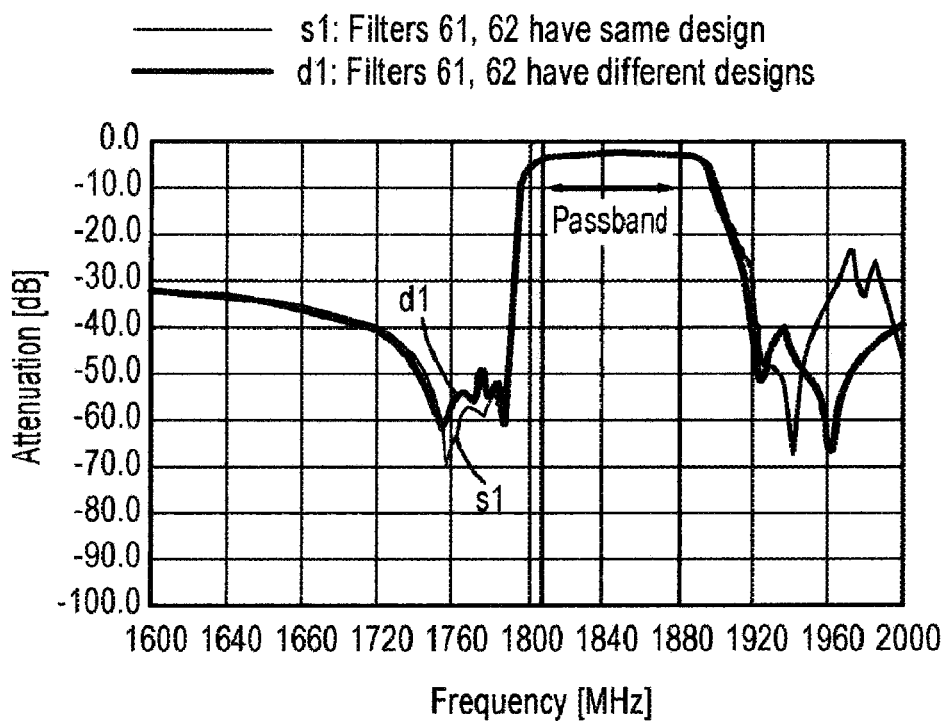
FIGS. 7A and 7B are graphs depicting pass characteristics calculated after converting balanced output to a single ended signal.
Figure 7B:
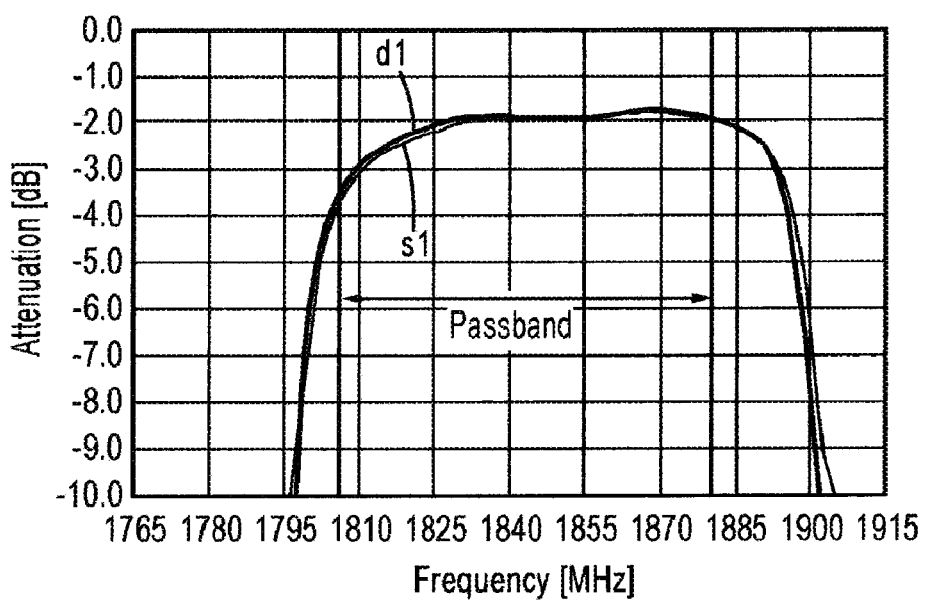

FIGS. 7A and 7B are graphs depicting pass characteristics calculated after converting the output of balanced signals between the Ant terminal and the reception terminals Rx1 and Rx2 to a single-ended signal. The thin solid line s1 represents the pass characteristics in the case where the filter 61 and the filter 62 have the same design in the circuit configuration depicted in FIG. 3, while the thick solid line d1 represents the pass characteristics in the case where the filter 61 and the filter 62 have different designs. FIG. 7B is a graph that enlarges a vicinity of the passband in FIG. 7A.

The graphs of FIGS. 7A and 7B indicate that the attenuation depicted by d1 within the passband is less than the attenuation depicted by s1. That is, attenuation in the passband decreases as a result of executing a design in which the characteristics of the resonators differ between the filter 61 and the filter 62. Note that in the graphs depicted in FIGS. 5 to 7, the vertical axis represents attenuation [dB], while the horizontal axis represents frequency [MHz].

Figure 8A:
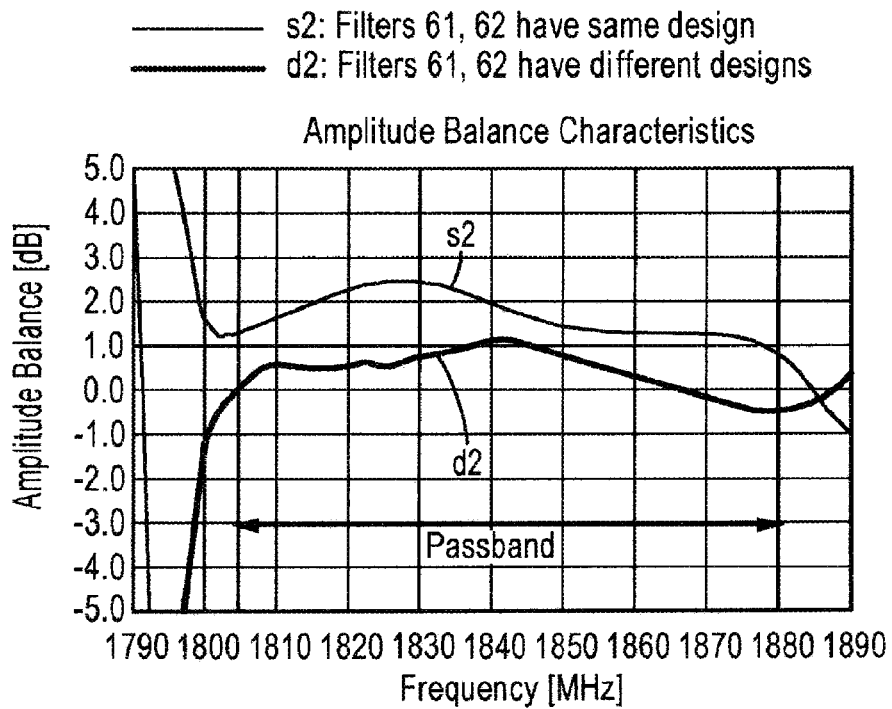
FIG. 8A is a graph depicting amplitude balance characteristics.

FIG. 8A is a graph depicting the amplitude balance characteristics of the Ant-Rx1 signal and the Ant-Rx2 signal. The thin line s2 represents the degree of difference between the amplitude of the Ant-Rx1 signal and the amplitude of the Ant-Rx2 signal in the case where the resonators of the filters 61 and 62 have the same design. The thick line d2 represents the degree of difference between the amplitude of the Ant-Rx1 signal and the amplitude of the Ant-Rx2 signal in the case where the resonators of the filters 61 and 62 have different designs.

Figure 8B:
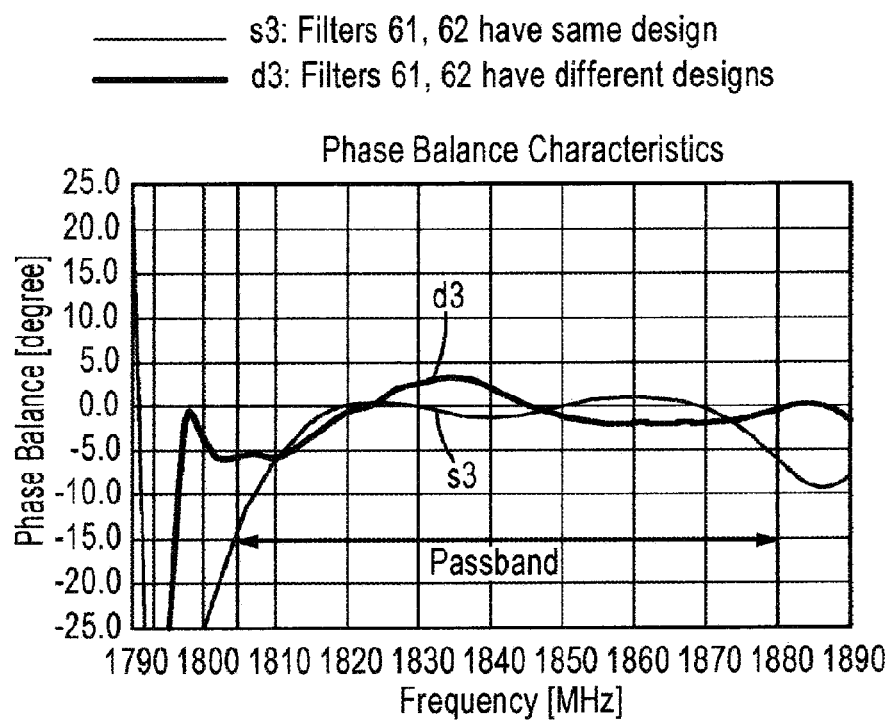
FIG. 8B is a graph depicting phase balance characteristics.

FIG. 8B is a graph depicting the phase balance characteristics of the Ant-Rx1 signal and the Ant-Rx2 signal. The thin line s3 represents the degree of shift between the phase of the Ant-Rx1 signal and the phase of the Ant-Rx2 signal in the case where the resonators of the filters 61 and 62 have the same design. The thick line d3 represents the degree of shift between the phase of the Ant-Rx1 signal and the phase of the Ant-Rx2 signal in the case where the resonators of the filters 61 and 62 have different designs.

The graphs of FIGS. 7A and 7B and FIGS. 8A and 8B depict that both the amplitude balance characteristics and the phase balance characteristics improve as a result of executing a design in which the resonators differ between the filters 61 and 62.

Exemplary Calculation for Optimal Design

Figure 9:
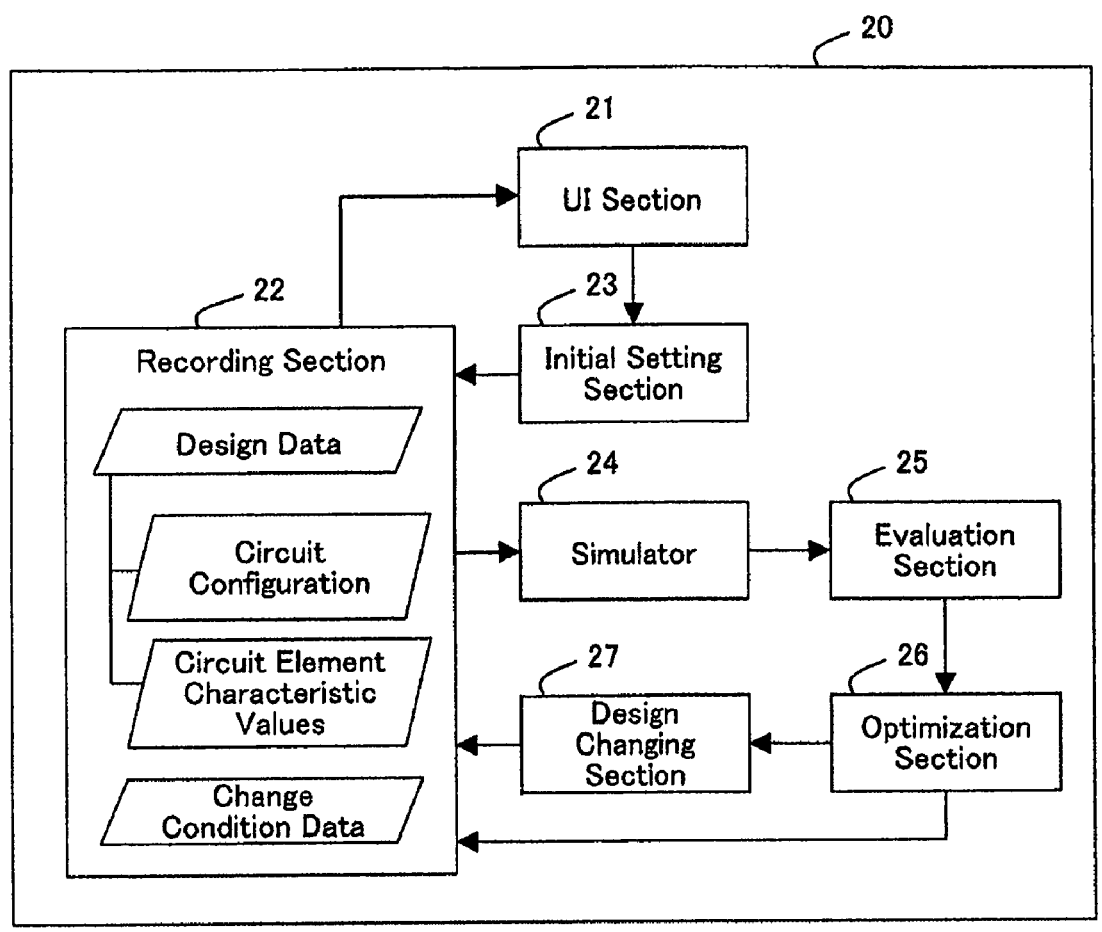
FIG. 9 depicts an exemplary configuration of a design system.

Next, an exemplary method of calculating arrangements or characteristic values of the resonators in the filter 6 at which the characteristics between the antenna terminal Ant and the reception terminals Rx1 and Rx2 improve will be described. FIG. 9 depicts an exemplary configuration of a design system that executes such a calculation. The design system 20 depicted in FIG. 9 includes a UI section 21, a recording section 22, an initial setting section 23, a simulator 24, an evaluation section 25, an optimization section 26, and a design changing section 27.

The design system 20 is realized by installing a prescribed program on a general-purpose computer such as a personal computer or a server machine. The UI section 21, the initial setting section 23, the simulator 24, the evaluation section 25, the optimization section 26 and the design changing section 27 are realized by the CPU of the computer executing the prescribed program. The recording section 22 is realized by a recording apparatus such as a RAM, ROM or HDD built into the computer or by an external recording apparatus. Consequently, a program for realizing the above functions or a recording medium on which the program is recorded is also included in the embodiments of the present invention.

The UI section 21 is a user interface section for receiving data input from a user such as a circuit designer and providing data to the user. The UI section 21 receives input of data such as initial design data for a filter and conditions for changing the design data, for example. The UI section 21 exchanges data with the user via an input device such as a mouse or a keyboard and an output device such as display (not depicted).

The initial setting section 23 records the initial filter design data to the recording section 22 based on an instruction from the user input via the UI section 21. This design data includes circuit configuration data representing the connection relation between the circuit elements constituting the circuit, and circuit element characteristic values representing the characteristic values of the circuit elements. Data depicting the circuit configuration of the duplexer depicted in FIG. 3, for example, is recorded as circuit configuration data. The resonant frequencies and capacitances of each of the resonators L1-S1 to S4 and L1-P1 to P4 and the resonators L2-S1 to S4 and L2-P1 to P4 constituting the filters 61 and 62 depicted in FIG. 3, for example, are recorded as circuit element characteristic values. The initial setting section 23 is also able to record data to be changed and change condition data designating the scope of the change to the recording section 22 in a design data optimization process (described below).

The initial setting section 23 may acquire such initial design data and change condition data by an input from the user via the UI section 21, or by reading a file designated by the user from another recording apparatus or the like.

The simulator 24 reads out the design data in the recording section 22 and simulates the circuit depicted by the design data. Frequency transfer characteristics (pass characteristics), balance characteristics or the like between given terminals, for example, are output to the evaluation section 25 as the simulation result. Commercial circuit simulation software can be used to realize the functions of the simulator 24.

The evaluation section 25 computes an evaluation value for the circuit based on the simulation result of the simulator 24. The evaluation value may, for example, be a value depicting to what extent the pass characteristics or balance characteristics between prescribed terminals of the circuit approximate the ideal state, or may be the actual pass characteristics or balance characteristics between prescribed terminals.

The optimization section 26 judges whether the design data is optimal based on the computed evaluation value of the evaluation section 25, and, if not optimal, causes the design changing section 27 to change the design data. The judgment as to whether the design data is optimal depends, for example, on whether the evaluation value has improved or whether there is room for improvement in the evaluation value. This judgment can be performed using, for example, the evaluation value, the number of simulations, the degree of change in the evaluation value, or the like.

The design changing section 27 changes circuit configuration data and/or circuit element characteristic values in the design data in accordance with an instruction from the optimization section 26. For example, the resonant frequencies and capacitances of the corresponding pair of resonators L1-S1 and L2-S1 are changed out of the resonators in the duplexer depicted in FIG. 3. Here, the judgment of whether to change the circuit configuration or the characteristic values of the resonators, and the judgment of which resonator pair to change or which characteristic values to change can be determined based on the change condition data recorded in the recording section 22.

How to change the design data to be changed as determined by the change condition data can also be determined by the optimization section 26 based on the evaluation value. Note that a known technique, such as simulated annealing (SA), a genetic algorithm (GA) or the simplex method, can be used as the optimization technique by the optimization section 26.

Once the design changing section 27 has changed design data, the simulator 24 and the evaluation section 25 repeat the calculation for the changed design data. The optimization section 26, having judged that the evaluation value is optimal (i.e., that the optimal solution has been obtained), records the current design data in the recording section 22 as optimal design data. The design data in the recording section 22 is thereby optimized.

Figure 10:
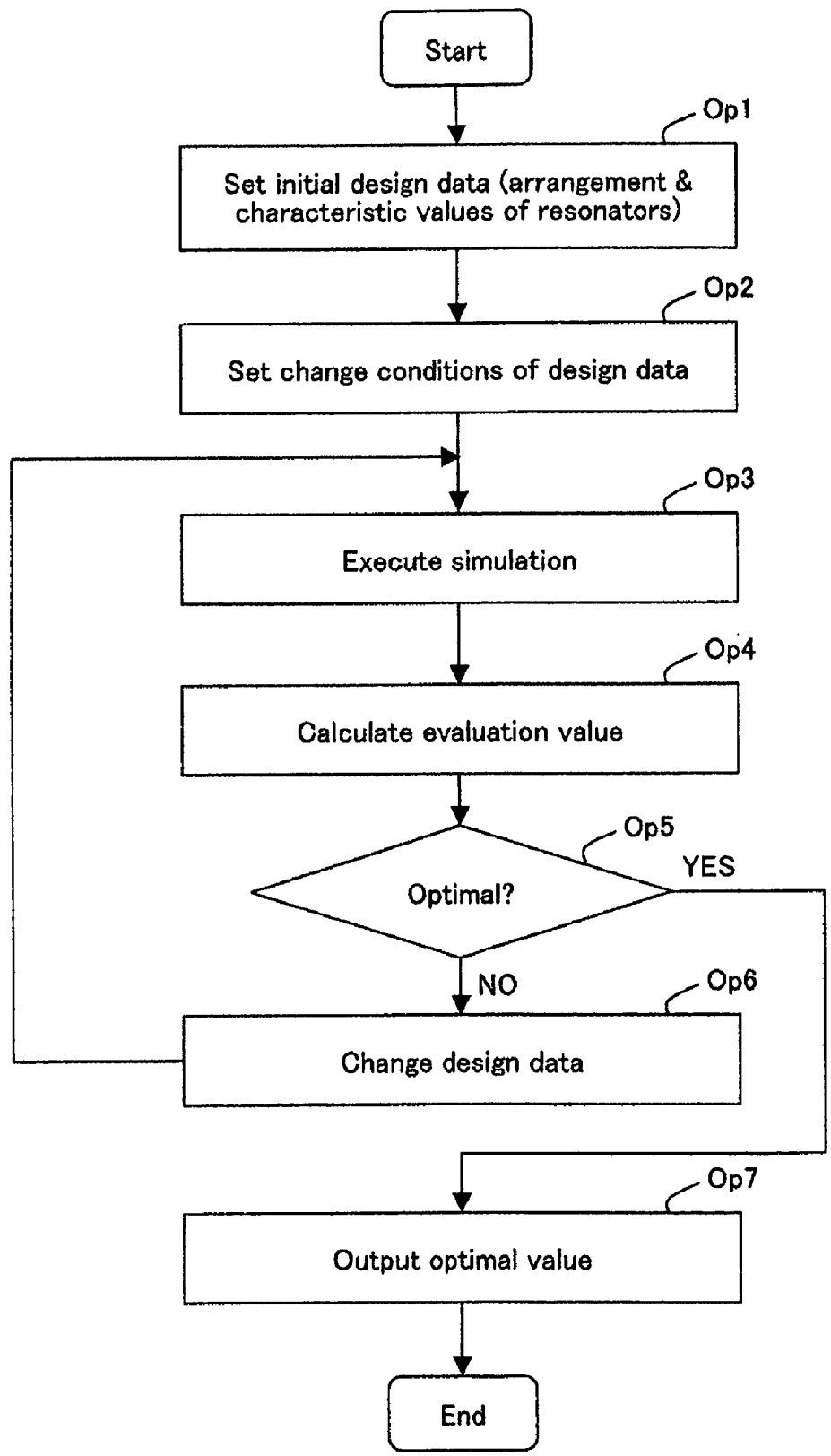
FIG. 10 is a flowchart depicting exemplary processing by the design system.

FIG. 10 is a flowchart depicting exemplary processing by the design system 20. In the example depicted in FIG. 10, firstly the initial setting section 23 receives input of initial design data for a duplexer from the user via the UI section 21, and records the received design data to the recording section 22 (Op I).

Here, the case where design data depicting the circuit configuration of the duplexer depicted in FIG. 3 is recorded as initial design data will be described as an example. In the initial design data, the arrangements and characteristic values of resonators are all equal for the filter 61 and the filter 62. That is, initial design data is design data for a circuit in which the frequency transfer characteristics of the filter 61 and the filter 62 are the same.

The initial setting section 23 also receives change condition data for the design data from the user via the UI section 21, and records the received change condition data to the recording section 22 (Op2). The change condition data is, for example, data designating items to be changed in order to differentiate the frequency transfer characteristics between the filters 61 and 62, the breadth of the change, and other change conditions.

Once the initial design data and the change condition data have been recorded to the recording section 22, the simulator 24 reads the design data, and calculates the pass characteristics and the balance characteristics between the antenna terminal Ant and the reception terminals Rx1 and Rx2 in the duplexer (Op3). The simulator 24 notifies the pass characteristics and the balance characteristics resulting from these calculations to the evaluation section 25.

The evaluation section 25 calculates an evaluation value based on the pass characteristics and the balance characteristics (Op4). The average attenuation in the passband, the average value in the passband of the difference in amplitudes between the signals of the reception terminals Rx1 and Rx2, and the maximum value in the passband of the shift from 180 degrees of the phase difference between the reception terminals Rx1 and Rx2 are given as exemplary evaluation values.

The optimization section 26 judges whether the design data is optimal based on the evaluation value (Op5). The optimization section 26 causes the design changing section to change the design data (Op6) and repeats the processing of Op3 and Op4 until the optimal solution is obtained (Op5: YES). In Op6, the design changing section 27 changes the design data in accordance with the conditions depicted in the change condition data.

In the case where, as an example, the change items depicted by the change condition data are the frequencies and capacitances of the series resonators L1-S1 to S4 and L2-S1 to S4, the design changing section 27 changes the design data such that the resonant frequencies or capacitances of mutually corresponding resonators differ between the filter 61 and the filter 62. The breadth of the change at this time can, for example, be recorded in advance in update condition data.

Note that a known optimization method such as simulated annealing or a genetic algorithm, for example, can be used in the Op5 judgment and the Op6 change. By using simulated annealing, for example, the design changing section 27 is able to repeatedly change the design data, such that there is a high probability of the evaluation value improving.

As described above, in the processing depicted in FIG. 10, an optimization process is executed in which the filter 61 and the filter 62 are firstly symmetrically designed such that the arrangements of the resonators are the same and the characteristics of the resonators are also equal, after which the circuit parameters (resonant frequencies or capacitances in the above example) of the filter 61 and the filter 62 are variously changed in search of values that improve the frequency transfer characteristics. The frequency transfer characteristics of the filter 61 and the filter 62 are thereby differentiated, such that the pass characteristics and the balance characteristics between the Ant terminal and the reception terminals Rx1 and Rx2 are improved, enabling optimal design data to be obtained.

Note that while the above processing was described in relation to the case where the characteristics of mutually corresponding resonators in two single-ended ladder filters are differentiated in the filter 6 depicted in FIG. 3, the circuit configuration to which the processing depicted in FIG. 10 is applied is not limited to this. For example, various balanced input/output filters such as will be depicted in the following second to sixth embodiments can be optimally designed using the processing of FIG. 10.

Second Embodiment

Figure 11:
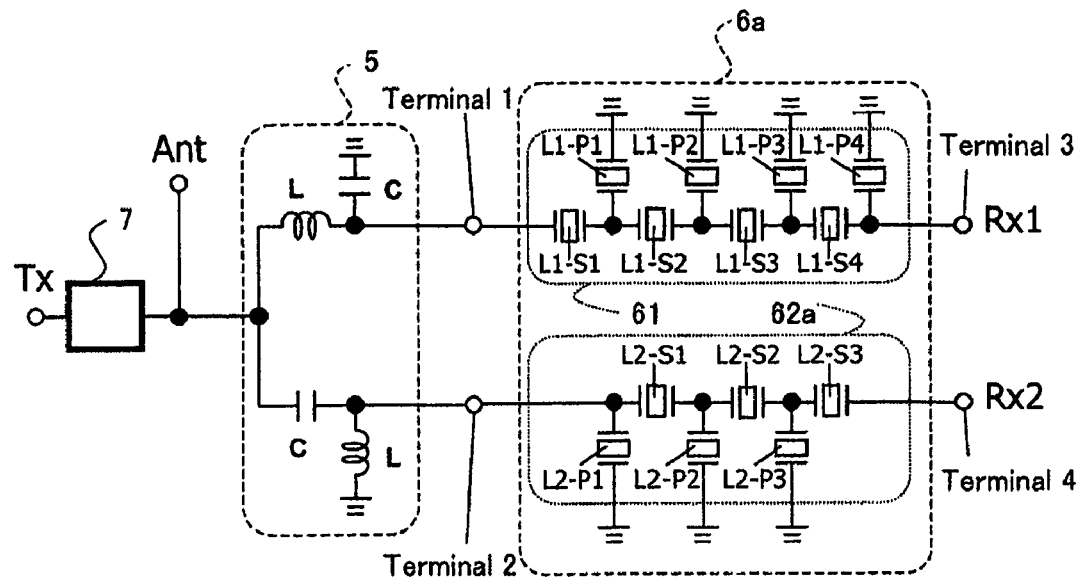
FIG. 11 depicts a circuit configuration of a duplexer in a second embodiment.

FIG. 11 depicts a circuit configuration of a duplexer in a second embodiment. In FIG. 11, the same numerals are assigned to circuit elements that are similar to FIG. 3. In the example depicted in FIG. 11, the resonator arrangements of the filter 61 and a filter 62a differ. That is, the filter 61 is a 4 pole ladder filter, whereas the filter 62a is a 3 pole ladder filter.

When the numbers of poles of the ladder filters thus differ, the frequency transfer characteristics will also differ.

Thus, in the processing depicted in FIG. 10, a combination in which the pass characteristics and/or the balance characteristics between the antenna terminal Ant and the reception terminals Rx1 and Rx2 are improved can be determined by variously changing the combination of pole numbers of the ladder filters constituting the filter 61 and the filter 62a, for example.

Note that a configuration in which the arrangements of the resonators differ is not limited to the example in which the pole numbers of the ladder filters are differentiated as depicted in FIG. 11. The duplexer may be configured such that the characteristics of a mutually corresponding resonator pair (e.g., resonators L1-S1 and L2-S1) mutually differ between the filter 61 and the filter 62a.

Third Embodiment

Figure 12:
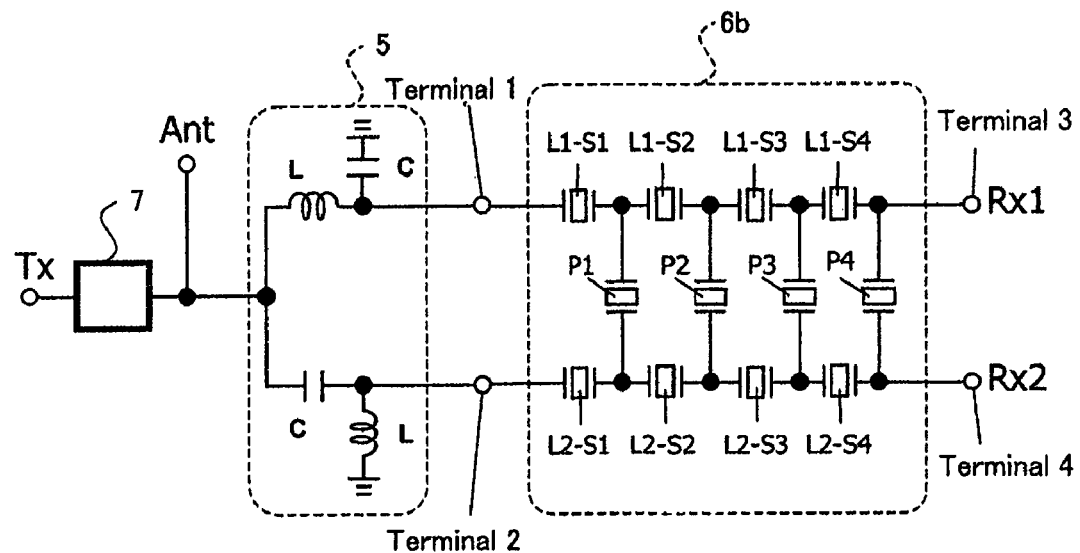
FIG. 12 depicts a circuit configuration of a duplexer in a third embodiment.

FIG. 12 depicts a circuit configuration of a duplexer in a third embodiment. In FIG. 12, the same numerals are assigned to circuit elements that are similar to FIG. 3. In the example depicted in FIG. 12, a balanced ladder filter 6b is used as the receive filter 6. That is, series resonators L1-S1 to S4 are connected between the terminals 1 and 3, while series resonators L2-S1 to S4 are connected between the terminals 2 and 4. Further, parallel resonators P1 to P4 that respectively link nodes on a line between the terminals 1 and 3 and nodes on a line between the terminals 2 and 4 are provided. The duplexer need only be configured such that the frequency transfer characteristics of the n-th series resonator from the terminal 1 and the n-th series resonator from the terminal 2

(e.g., resonators L1-S3 and L2-S3 if n=3) mutually differ in the balanced ladder filter 6b (n need only be at least one of 1, 2, 3 and 4). Note that the value of n and the appropriate characteristic values of the n-th series resonators can, for example, be determined by the processing depicted in FIG. 10. The pass characteristics and/or the balance characteristics in the duplexer can thereby be improved.

Fourth Embodiment

Figure 13:
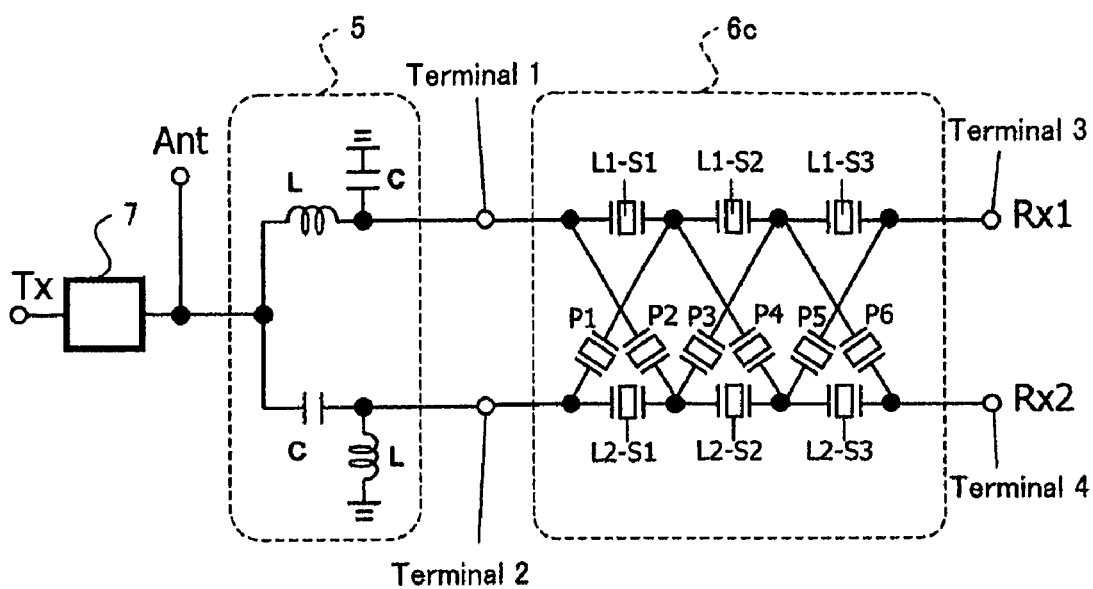
FIG. 13 depicts a circuit configuration of a duplexer in a fourth embodiment.

FIG. 13 depicts a circuit configuration of a duplexer in a fourth embodiment. In FIG. 13, the same numerals are assigned to circuit elements that are similar to FIG. 3. In the example depicted in FIG. 13, a balanced lattice filter 6c is used as the receive filter 6.

That is, series resonators L1-S1 to S3 are connected between the terminals 1 and 3, while series resonators L2-S1 to S3 are connected between the terminals 2 and 4. Further, parallel resonators P1 to P6 that respectively link nodes on a line between the terminals 1 and 3 and nodes on a line between the terminals 2 and 4 are provided.

The duplexer need only be configured such that the frequency transfer characteristics of the n-th series resonator from the terminal 1 and the n-th series resonator from the terminal 2 (e.g., resonators L1-S3 and L2-S3 if n=3) mutually differ in the balanced lattice filter 6c (n need only be at least one of 1, 2 and 3).

Also, the duplexer may be configured such that the frequency transfer characteristics of one of the plurality of parallel resonators P1 to P6 differ from the frequency transfer characteristics of the other parallel resonators. This enables also the frequency characteristics between the terminals 1 and 3 to be differentiated from the frequency characteristics between the terminals 2 and 4.

The value of n and the appropriate characteristic values of the n-th series resonators or the appropriate characteristic values of the parallel resonators can, for example, be determined by the processing depicted in FIG. 10. The pass characteristics and/or the balance characteristics in the duplexer can thereby be improved.

Fifth Embodiment

Figure 14:
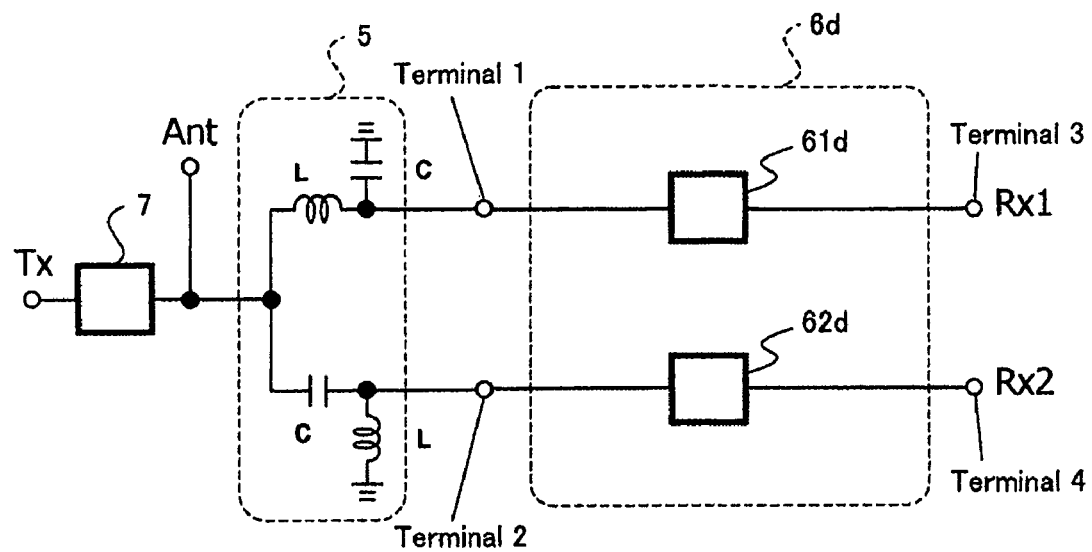
FIG. 14 depicts a circuit configuration of a duplexer in a fifth embodiment.

FIG. 14 depicts a circuit configuration of a duplexer in a fifth embodiment. In FIG. 14, the same numerals are assigned to similar circuit elements. In the example depicted in FIG. 14, a receive filter 6d is formed by a double-mode filter 61d connected between the terminals 1 and 3 and a double-mode filter 62d connected between the terminals 2 and 4. The double-mode filters are filters that use a surface acoustic wave or a boundary acoustic wave.

Figure 15:
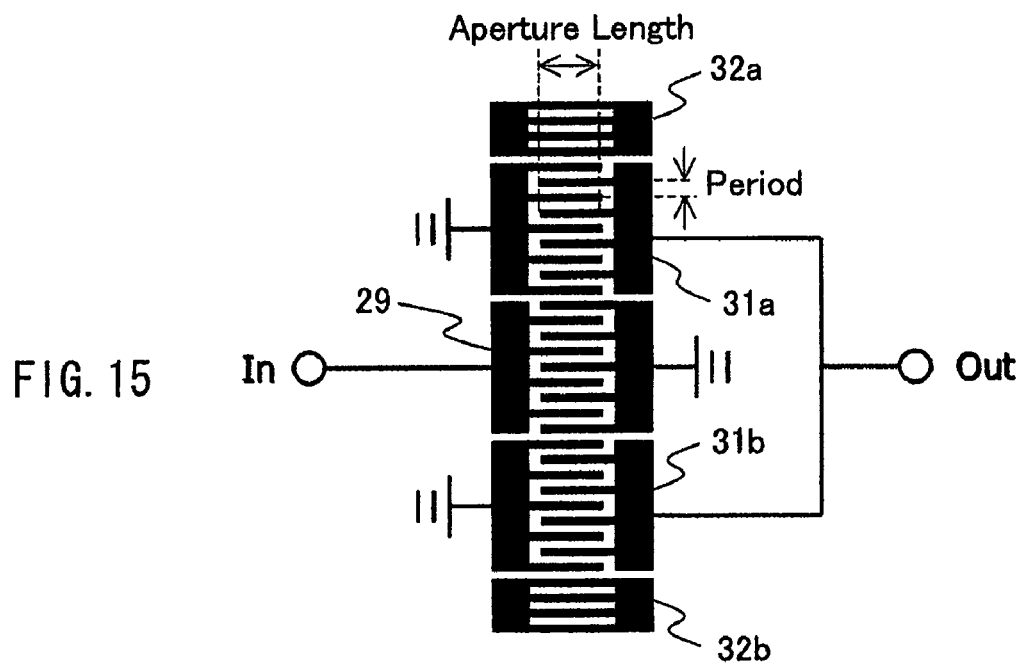
FIG. 15 depicts an exemplary configuration of a double-mode surface acoustic wave filter.

FIG. 15 depicts an exemplary configuration of a double-mode surface acoustic wave filter. The double-mode surface acoustic wave filter of FIG. 15 includes an input IDT 29 to which an input terminal In is connected, output IDTs 31a and 31b provided on each side of the input IDT 29, and reflectors 32a and 32b provided on the outside of the output IDTs 31a and 31b. An output terminal Out is connected to the output IDTs 31a and 31b.

In this case, the duplexer need only be configured such that the pair number of the input IDT 29, the pair number of the output IDTs 31a and 31b, the pair number of the reflectors 32a and 32b, the aperture lengths of the input IDT 29 and the output IDTs 31a and 31b, or the like, mutually differ between the double-mode filters 61d and 62d. The frequency characteristics of the filters 61d and 62d can thereby be differentiated, which in turn enables the pass characteristics and/or the balance characteristics of the duplexer to be improved.

Sixth Embodiment

Figure 16:
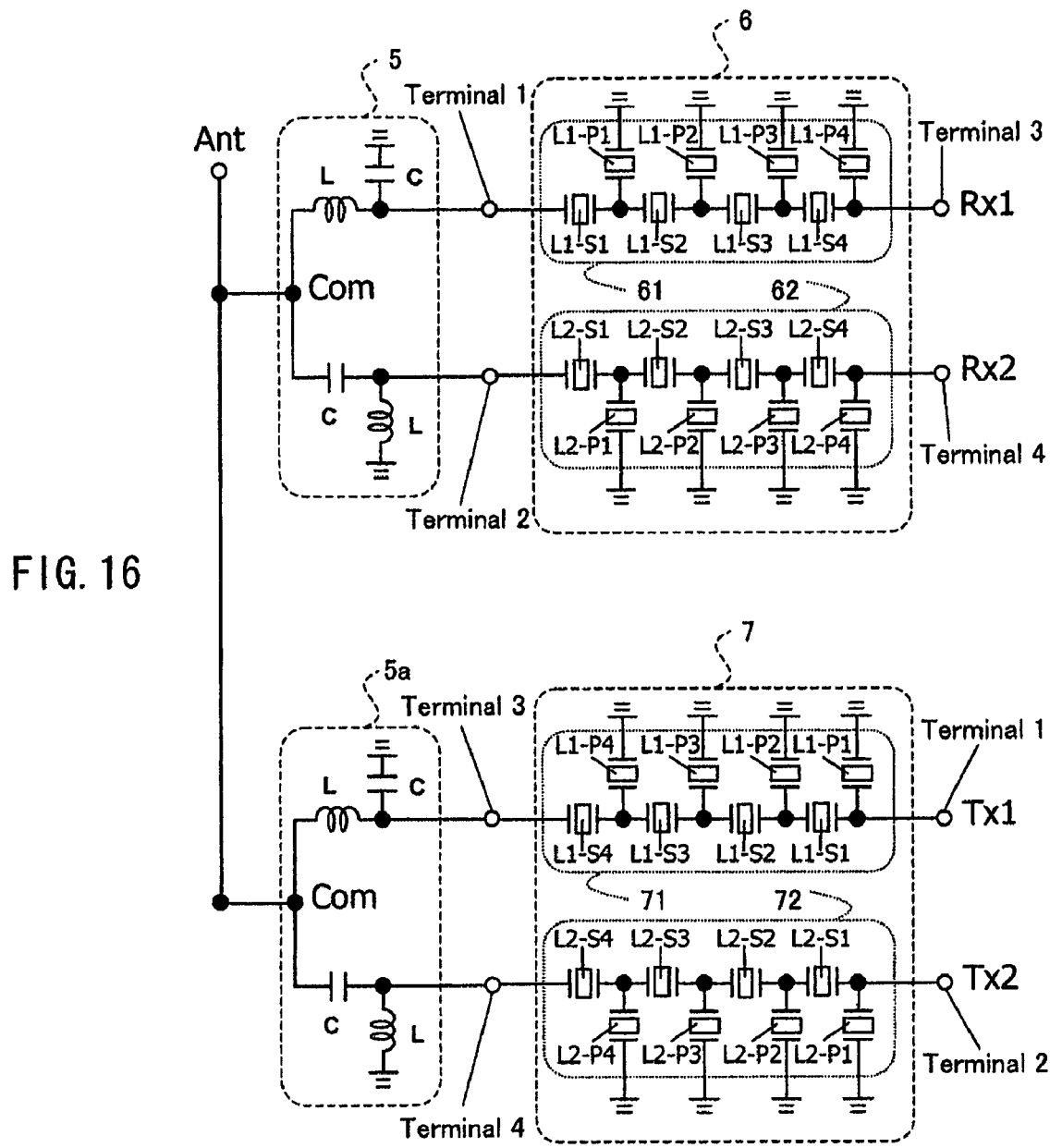
FIG. 16 depicts a circuit configuration in which the transmit filter is constituted by a balanced input/output filter.

In the above first to fifth embodiments, cases where the receive filter 6 is constituted by a balanced input/output filter have been described. Similarly to these embodiments, the transmit filter 7 may also be constituted by a balanced input/output filter. FIG. 16 depicts a circuit configuration in the case where the transmit filter 7 is also constituted by a balanced input/output filter.

In the example depicted in FIG. 16, the transmit filter 7 is a balanced input/output filter in which the terminal 1 and the terminal 2 are balanced input terminals, and the terminal 3 and the terminal 4 are balanced output terminals. The transmit filter 7 is a filter section that passes only a transmission frequency band out of balanced signals input from the terminal 1 and the terminal 2, and outputs balanced signals from the terminal 3 and the terminal 4.

A conversion circuit 5a is connected to the terminal 3 and the terminal 4. The conversion circuit 5a converts the balanced signals input from the terminal 3 and the terminal 4 to a single signal, and outputs the single signal to the antenna terminal Ant.

The configuration depicted in FIG. 16 enables a balanced output power amplifier to be placed upstream of the transmit filter, for example. Similarly to the first to fifth embodiments, the pass characteristics or balance characteristics between the antenna terminal Ant and the transmission terminals Tx1 and Tx2 are improved by differentiating the frequency transfer characteristics of a path K1 between the terminals 1 and 3 and a path K2 between the terminals 2 and 4.

In the example depicted in FIG. 16, the transmit filter 7 is constituted by two single-ended ladder filters (filters 71, 72), although the circuit configuration of a balanced input/output filter that can be used for the transmit filter 7 is not limited to this. For example, filters used for the receive filter in the second to fifth embodiments may similarly be used for the transmit filter.

Seventh Embodiment

The present embodiment is a communication device that includes a duplexer as depicted in the above first to sixth embodiments.

Figure 17:
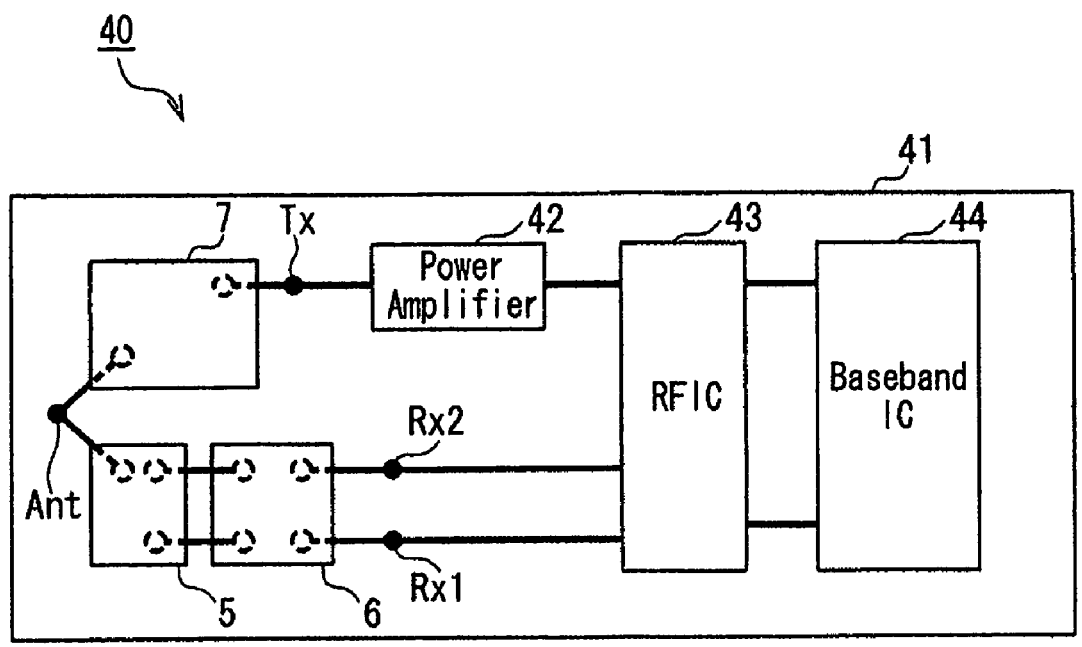
FIG. 17 depicts a schematic configuration of a communication device that includes the duplexer depicted in FIG. 3.

FIG. 17 depicts a schematic configuration of a communication device 40 that includes the duplexer having the circuit configuration depicted in FIG. 3. The same numerals are assigned to constituent elements depicted in FIG. 17 that correspond to constituent elements of the circuit depicted in FIG. 3. In the communication device 40 depicted in FIG. 17, a transmit filter 7, a receive filter 6, a conversion circuit 5, a power amplifier 42, a radio frequency integrated circuit (RFIC) 43 and a baseband integrated circuit (IC) 44 are provided on a module substrate 41. The receive filter 6 and the transmit filter 7 can be respectively formed by a semiconductor chip. The conversion circuit 5 may, for example, be formed by an integrated passive device (IPD) chip.

The connection of the antenna terminal (common terminal) Ant with the transmit filter 7 and the conversion circuit 5, and the connection of the conversion circuit 5 with the receive filter 6 are realized by a wiring pattern formed on the module substrate 41. Note that the antenna terminal Ant is connected to an antenna (not depicted) included in the communication device 40.

The transmission terminal Tx is connected to the RFIC 43 via the power amplifier 42, and the reception terminals Rx1 and Rx2 are also connected to the RFIC 43. The RFIC 43 is connected to the baseband IC 44. The RFIC 43 is constituted by a semiconductor chip or other components. Circuits including a receiving circuit for processing reception signals input from the reception terminals Rx1 and Rx2 and a transmitting circuit for processing transmission signals to be output to the antenna terminal Ant via the power amplifier 42 are integrated in the RFIC 43. Note that the power amplifier 42 is a circuit that amplifies transmission signals output from the transmitting circuit of the RFIC 43 and inputs the amplified signals to the transmission terminal Tx of the transmit filter 7.

The baseband IC 44 is also constituted by a semiconductor chip or other components. A circuit for converting reception signals received from the receiving circuit included in the RFIC 43 to audio signals or packet data and a circuit for converting the audio signals or packet data to transmission signals and outputting the transmission signals to the transmitting circuit included in the RFIC 43 are integrated in the baseband IC 44.

While not depicted, an output device such as a speaker or a display, for example, is connected to the baseband IC 44, and the audio signals or packet data converted from the reception signals by the baseband IC 44 can be perceived by the user of the communication device 40 by being output. An input device such as microphone or a button included in the communication device 40 is also connected to the baseband IC 44, enabling the baseband IC 44 to convert audio or data input by a user to transmission signals.

Note that the configuration of the communication device 40 is not limited to the example depicted in FIG. 17. A module consisting of a set of components used in a portion of the communication device 40 and including a duplexer as in the first to sixth embodiments is also encompassed by the embodiments of the present invention.

For example, a package component of a duplexer as in the first to sixth embodiments can be formed by flip-chip mounting chips respectively forming the conversion circuit 5, the receive filter 6 and the transmit filter 7 on a ceramic package and covering the chips with a metal lid to form an airtight seal.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that various changes, substitutions, and alterations could be made hereto without departing from the spirit and scope of the invention.

The invention claimed is:

1. A filter comprising:
   a filter section that is provided with a balanced input terminal including a terminal 1 and a terminal 2 and a balanced output terminal including a terminal 3 and a terminal 4, and that passes a signal in a passband out of balanced signals input from the balanced input terminal and outputs the signal from the balanced output terminal; and
   a balanced-to-unbalanced converter that is connected between the balanced input terminal of the filter section and a single terminal, and that divides a signal input from the single terminal into two signals of opposite phase and inputs the two signals respectively to the terminal 1 and the terminal 2 of the balanced input terminal, or a balanced-to-unbalanced converter that is connected between the balanced output terminal and a single terminal, and that combines balanced signals output from the terminal 3 and the terminal 4 of the balanced output terminal and outputs the combined signal to the single terminal,
   wherein in the filter section, a frequency transfer characteristic between the terminals 1 and 3 differs from a frequency transfer characteristic between the terminals 2 and 4,
   wherein in the filter section, a single-ended filter 1 is connected between the terminals 1 and 3, a single-ended filter 2 is connected between the terminals 2 and 4, and frequency transfer characteristics of the single-ended filter 1 and the single-ended filter 2 mutually differ.

2. The filter according to claim 1,
   wherein the single-ended filter 1 and the single-ended filter 2 are ladder filters, and
   in the single-ended filter 1 and the single-ended filter 2, resonator arrangements mutually differ, or resonator arrangements are the same and at least one of mutually corresponding resonator pairs mutually differ in resonant frequency or capacitance.

3. The filter according to claim 2,
   wherein the single-ended filter 1 and the single-ended filter 2 are provided with surface acoustic wave resonators or boundary acoustic wave resonators that each include a reflector and an interdigital transducer that has a comb-shaped electrode, and
   in the single-ended filter 1 and the single-ended filter 2, resonator arrangements are the same and at least one of mutually corresponding resonator pairs mutually differ in at least one of pair number of the comb-shaped electrodes, aperture length of the comb-shaped electrodes, and period of the interdigital transducers and the reflectors.

4. The filter according to claim 2,
   wherein the single-ended filter 1 and the single-ended filter 2 are provided with film bulk acoustic resonators, and
   in the single-ended filter 1 and the single-ended filter 2, resonator arrangements are the same and at least one of mutually corresponding resonator pairs mutually differ in at least one of shape of the film bulk acoustic resonators, area of the film bulk acoustic resonators, and thickness of film constituting the film bulk acoustic resonators.

5. The filter according to claim 2,
   wherein the single-ended filter 1 and the single-ended filter 2 are double-mode filters that are each provided with an input interdigital transducer and an output interdigital transducer and use a surface acoustic wave or a boundary acoustic wave, and
   in the single-ended filter 1 and the single-ended filter 2, resonator arrangements are the same and at least one of mutually corresponding resonator pairs mutually differ in at least one of pair number of the input interdigital transducers, pair number of the output interdigital transducers, aperture length of the input and output interdigital transducers, and period of the interdigital transducers and reflector sections.

6. A filter, comprising:
   a filter section that is provided with a balanced input terminal including a terminal 1 and a terminal 2 and a balanced output terminal including a terminal 3 and a terminal 4, and that passes a signal in a passband out of balanced signals input from the balanced input terminal and outputs the signal from the balanced output terminal; and a balanced-to-unbalanced converter that is connected between the balanced input terminal of the filter section and a single terminal, and that divides a signal input from the single terminal into two signals of opposite phase and inputs the two signals respectively to the terminal 1 and the terminal 2 of the balanced input terminal, or a balanced-to-unbalanced converter that is connected between the balanced output terminal and a single terminal, and that combines balanced signals output from the terminal 3 and the terminal 4 of the balanced output terminal and outputs the combined signal to the single terminal, wherein in the filter section, a frequency transfer characteristic between the terminals 1 and 3 differs from a frequency transfer characteristic between the terminals 2 and 4, wherein the filter section is a balanced lattice filter that includes series resonators respectively connected in series between the terminals 1 and 3 and between the terminals 2 and 4, and a plurality of parallel resonators connected between nodes on a line between the terminals 1 and 3 and nodes on a line between the terminals 2 and 4, and at least one of the plurality of parallel resonators differs from the other parallel resonators in resonant frequency or capacitance, wherein the balanced filter is provided with surface acoustic resonators or boundary acoustic resonators that each include a reflector and an interdigital transducer that has a comb-shaped electrode, and at least one of the plurality of parallel resonators differs from the other parallel resonators in at least one of pair number of the comb-shaped electrodes, aperture length of the comb-shaped electrodes, and period of the interdigital transducers and the reflectors.

7. A duplexer that has a common terminal, a transmission terminal and a reception terminal, comprising:

a transmit filter connected between the common terminal and the transmission terminal; and a receive filter connected between the common terminal and the reception terminal, wherein at least one of the transmit filter and the receive filter comprises:

a filter section that is provided with a balanced input terminal including a terminal 1 and a terminal 2 and a balanced output terminal including a terminal 3 and a terminal 4, and that passes a signal in a passband out of balanced signals input from the balanced input terminal and outputs the signal from the balanced output terminal; and a balanced-to-unbalanced converter that is connected between the balanced input terminal of the filter section and a single terminal, and that divides a signal input from the single terminal into two signals of opposite phase and inputs the two signals respectively to the terminal 1 and the terminal 2 of the balanced input terminal, or a balanced-to-unbalanced converter that is connected between the balanced output terminal and a single terminal, and that combines balanced signals output from the terminal 3 and the terminal 4 of the balanced output terminal and outputs the combined signal to the single terminal, wherein in the filter section, a frequency transfer characteristic between the terminals 1 and 3 differs from a frequency transfer characteristic between the terminals 2 and 4, wherein in the filter section, a single-ended filter 1 is connected between the terminals 1 and 3, a single-ended filter 2 is connected between the terminals 2 and 4, and frequency transfer characteristics of the single-ended filter 1 and the single-ended filter 2 mutually differ.

8. A communication device comprising the duplexer according to claim 7.

9. A filter design method for computing by a computer an optimal arrangement and an optimal characteristic value of resonators constituting a filter, comprising:

a setting by storing in a recording section accessible by the computer, circuit design data that represents a balanced-to-unbalanced conversion circuit connected between a single terminal and a balanced terminal A1 including a terminal 1 and a terminal 2, and a filter circuit provided with a plurality of resonators and connected between the balanced terminal A1 and a balanced terminal A2 including a terminal 3 and a terminal 4, wherein an arrangement and a characteristic value of resonators on a path between the terminals 1 and 3 equal an arrangement and a characteristic value of resonators on a path between the terminals 2 and 4;

a changing by changing the arrangement or the characteristic value of the resonators depicted by the circuit design data so as to differ between the resonators on the path between the terminals 1 and 3 and the resonators on the path between the terminals 2 and 4;

a simulating by reading the circuit design data changed in the changing from the recording section, and calculating a frequency transfer characteristic between the single terminal and the balanced terminal A2;

an evaluating by generating evaluation data from the frequency transfer characteristic calculated in the simulating; and an optimizing by computing the optimal arrangement and the optimal characteristic value of the resonators, by determining in which way to change the characteristic value of the resonators and executing the changing, based on the evaluation data generated in the evaluating, and repeating the simulating and the evaluating.

* * * * *